(12) United States Patent
Petty et al.

(10) Patent No.: US 10,412,252 B2
(45) Date of Patent: *Sep. 10, 2019

(54) DIGITAL VIDEO CAMERA

(71) Applicant: Blackmagic Design Pty Ltd, Port Melbourne (AU)

(72) Inventors: Grant Petty, Melbourne (AU); Simon Kidd, Melbourne (AU); John Vanzella, Melbourne (AU); Michael Cornish, Melbourne (AU); Shannon Smith, Melbourne (AU); Suan Heng Yeo, Point Cook (AU); Nathan Lee, Melbourne (AU)

(73) Assignee: BLACKMAGIC DESIGN PTY LTD, Port Melbourne (AU)

( * ) Notice: Subject to any disclaimer, the term of this patent is extended or adjusted under 35 U.S.C. 154(b) by 8 days.

This patent is subject to a terminal disclaimer.

(21) Appl. No.: 15/802,764

(22) Filed: Nov. 3, 2017

(65) Prior Publication Data

US 2018/0054542 A1   Feb. 22, 2018

Related U.S. Application Data

(63) Continuation of application No. 15/093,801, filed on Apr. 8, 2016, now Pat. No. 9,838,558.

(30) Foreign Application Priority Data

Apr. 10, 2015   (AU) ................................ 2015901286

(51) Int. Cl.
*H04N 1/00* (2006.01)
*G02B 7/02* (2006.01)
(Continued)

(52) U.S. Cl.
CPC ......... *H04N 1/00981* (2013.01); *G02B 7/008* (2013.01); *G02B 7/028* (2013.01);
(Continued)

(58) Field of Classification Search
None
See application file for complete search history.

(56) References Cited

U.S. PATENT DOCUMENTS

2004/0190261 A1   9/2004 Lopatinsky et al.
2005/0134727 A1   6/2005 Teramoto et al.
(Continued)

FOREIGN PATENT DOCUMENTS

JP   2007174526 A   7/2007
JP   2009033547 A   2/2009
(Continued)

OTHER PUBLICATIONS

Australian Search Report issued for Application No. 2015901286 dated Dec. 16, 2015, 12 pgs.
(Continued)

*Primary Examiner* — Roberto Velez
*Assistant Examiner* — Quan Pham
(74) *Attorney, Agent, or Firm* — Haynes and Boone, LLP

(57) ABSTRACT

A digital video camera, including a heat management system, which includes at least one inlet and at least one outlet in the housing to enable air to flow through the housing. The heat management system also includes a first heat sink thermally connected to an image sensor(s), and a second heat sink thermally connected to a data processing unit(s), and a centrifugal fan. The centrifugal fan is configured to draw air into the front of the fan in an axial direction and push air radially out in a sideways direction, whereby air travels through the inlet(s) over the first heat sink and then over the second heat sink to the outlet(s).

20 Claims, 8 Drawing Sheets

(51) Int. Cl.
*G02B 7/00* (2006.01)
*G03B 17/55* (2006.01)
*G06F 1/20* (2006.01)
*H04N 5/225* (2006.01)
*H05K 7/20* (2006.01)
*H01L 23/34* (2006.01)

(52) U.S. Cl.
CPC ............... *G03B 17/55* (2013.01); *G06F 1/20* (2013.01); *H04N 5/2252* (2013.01); *H01L 23/34* (2013.01); *H04N 2201/0084* (2013.01); *H05K 7/20509* (2013.01)

(56) References Cited

U.S. PATENT DOCUMENTS

| 2008/0161998 | A1 | | 7/2008 | Yokoi | |
|---|---|---|---|---|---|
| 2009/0244363 | A1 | | 10/2009 | Sugimura et al. | |
| 2013/0278820 | A1 | * | 10/2013 | Lin | H05K 7/2039 |
| | | | | | 348/374 |
| 2014/0055671 | A1 | | 2/2014 | Kawamura | |
| 2015/0062409 | A1 | | 3/2015 | Tsuzuki | |
| 2016/0028914 | A1 | * | 1/2016 | Ide | H04N 1/00981 |
| | | | | | 358/1.14 |
| 2016/0270256 | A1 | * | 9/2016 | Abe | H05K 7/20209 |

FOREIGN PATENT DOCUMENTS

| JP | 2011228768 | A | | 11/2011 |
|---|---|---|---|---|
| JP | 2012064897 | A | | 3/2012 |
| JP | 20120477798 | A | | 3/2012 |
| JP | 2013219590 | A | * | 10/2013 |
| JP | 5565517 | B1 | | 8/2014 |
| JP | 2014212514 | A | * | 11/2014 |
| JP | 2015126128 | A | * | 7/2015 |

OTHER PUBLICATIONS

Extended European Search Report dated Aug. 3, 2016 issued in Application No. 16164484.4, 7 pgs.

* cited by examiner

DIGITAL VIDEO CAMERA

PRIORITY DATA

This application is a continuation of U.S. patent application Ser. No. 15/093,801, filed Apr. 8, 2016 which claims priority to Australian Application No. 2015901286, filed Apr. 10, 2015, the disclosures of which are hereby incorporated by reference in their entirety.

FIELD OF THE INVENTION

The present invention relates to digital video cameras and their construction.

BACKGROUND OF THE INVENTION

During editing for cinema and television, footage taken from a number of different cameras can be edited together in a single scene. To ensure footage from different cameras match it is important that each of the cameras used are capable of outputting footage of equal quality, for example in relation to resolution, dynamic range, frame rate and colour. If the quality is too different, the transitions between footage from different cameras will be obvious to the viewer and not to a standard expected for cinematographic use.

In some situations, there is a requirement to use a video camera that is capable of fitting in a confined space or location that a standard camera cannot, such as in a refrigerator or other enclosure; or mounted to a drone for aerial footage. Whilst small sized cameras have been available in the past, there has been a limitation on the quality of the image produced by such cameras, making their utility in high quality cinema and television applications limited.

One of the problems faced by a digital video camera designer that limits the ability to make compact cinemaquality cameras is the need to use certain high powered components. These high powered components generate a large amount of heat, such that if they are confined in a small housing they will overheat and the image will deteriorate and it is possible that the camera will fail. This problem is becoming more pronounced as the desired image resolution and quality increases.

Accordingly there is a need for a video camera design that addresses the above drawbacks of the prior art or at least provides a useful alternative to the conventional cinematographic video camera design.

Reference to any prior art in the specification is not an acknowledgment or suggestion that this prior art forms part of the common general knowledge in any jurisdiction or that this prior art could reasonably be expected to be understood, regarded as relevant, and/or combined with other pieces of prior art by a skilled person in the art.

SUMMARY OF THE INVENTION

In one form, a video camera made in accordance with an embodiment of the present invention provides cooling across the camera housing using a centrifugal fan in combination with two heat sinks. A first heat sink is thermally connected to an image sensor and the second heat sink is thermally connected to a data processing unit. The data processing unit produces more heat than the image sensor. The direction of air flow is such that air flows across the first heat sink before flowing across the second heat sink.

According to a first aspect, the present invention provides a digital video camera, including:
a housing;
at least one image sensor to convert light into electrical signals;
an optical system associated with the image sensor;
a lens mount for releasably engaging a lens or other optical module;
data processing unit(s) to process image data received from the image sensor(s); and
a heat management system, which includes:
   at least one inlet and at least one outlet in the housing to enable air to flow through the housing;
   an inlet-side heat sink thermally connected to the image sensor(s), and an outlet-side heat sink thermally connected to the data processing unit(s), said inlet-side heat sink being separated from the outlet-side heat sink; and
   a fan configured to draw air into the housing through the inlet(s) over the inlet-side heat sink and push air over the outlet-side heat sink out the outlet(s);
wherein the fan is a centrifugal fan, such that air is drawn into the front of the fan and pushed out one side of the fan.

According to a second aspect, the present invention provides a digital video camera, including:
a housing;
at least one image sensor to convert light into electrical signals;
an optical system associated with the image sensor;
a lens mount for releasably engaging a lens or other optical module;
data processing unit(s) to process image data received from the image sensor(s); and
a heat management system, which includes:
   at least one inlet and at least one outlet in the housing to enable air to flow through the housing;
   a first heat sink thermally connected to the image sensor(s), and a second heat sink thermally connected to the data processing unit(s); and
   a centrifugal fan configured to draw air into the front of the fan in a generally axial direction and push air radially out in a sideways direction, whereby air is drawn into the housing through the inlet(s) over the first heat sink and then over the second heat sink out the outlet(s).

The first heat sink is preferably an inlet-side heat sink. The second heat sink is preferably an outlet-side heat sink.

The first/inlet-side heat sink is preferably separated from the second/outlet-side heat sink.

The first/inlet-side heat sink may additionally be thermally connected to a processor, which may be associated with the image sensor.

The housing is preferably provided as two components, a front housing component and a rear housing component. The front housing component may be made from magnesium. The rear housing component may be made from a plastic, such as a thermoplastic polymer, for example ABS (Acrylonitrile butadiene styrene).

The heat sinks may be made from die cast aluminium, however it will be appreciated that other materials, such as magnesium may be used and alternative manufacturing techniques may be used, such as forging.

It is advantageous that the inlet(s) and outlet(s) are provided on the rear housing component. The housing is generally rectangular, having a front side, a rear side, a top side, a bottom side and a left and right side. The inlet(s) and outlet(s) are preferably located on opposing sides of the housing. The inlet(s) and outlet(s) may be provided on the same side of the housing. In some embodiments the inlet(s) and outlet(s) may be on adjacent sides of the housing. In an embodiment, separate inlets may be provided on opposite sides of the housing and the outlet(s) may be provided on one of those sides. The inlet(s) and outlet(s) are preferably openings in the housing. The housing is advantageously shaped such that the openings cannot be obstructed by laying the camera on either side.

It is also advantageous that the rear housing component contains the data processing unit(s). The data processing unit(s) preferably comprises a main printed circuit board (PCB), which may include a field programmable gate array (FPGA).

The rear housing component also preferably includes the second/outlet-side heat sink.

External mounting arrangements are provided, enabling the digital video camera to be mounted to external accessories, such as tripods or arms. The mounting arrangements are preferably provided on the front housing component, as the front housing component is typically made from a stronger material than the rear housing component. The mounting arrangement may be provided on the top and/or bottom of the housing.

The front housing component also advantageously includes one or more microphones, positioned such that they are mechanically isolated from the fan to minimise noise transmission through camera to the microphone's transducer.

The thermal connection between the first/inlet-side heat sink and the image sensor and the thermal connection between the second/outlet-side heat sink and the data processing unit draws heat away from the image sensor and the data processing unit respectively. The heat management system can include a cooling subsystem in some embodiments to move heat generated by the image sensor. The cooling subsystem can include a heat transfer element. The heat transfer element could include an active cooler, such as a Peltier cooler or heat pipe or the like. The image sensor is typically mounted to a substrate, such as a sensor PCB. The Peltier cooler may be located between the image sensor and the first/inlet-side heat sink. Thus, the thermal connection between the image sensor and the first/inlet-side heat sink can be direct or indirect.

The fan is preferably located between the first/inlet-side heat sink and the second/outlet-side heat sink. The fan may be located in the flow path after the first/inlet-side heat sink and the second/outlet-side heat sink. The main internal components may be stacked back to back in a single direction, such that they are generally aligned in series. The centrifugal fan blows air in a direction that is sideways to the stack direction.

A spacer is preferably provided to physically separate the first/inlet-side heat sink and the second/outlet-side heat sink. The spacer may be made from a low thermally conductive material, such as plastic, to provide a thermal break between the first/inlet-side heat sink and the second/outlet-side heat sink. The spacer surrounds the fan and may include a rim that extends around the inlet-side of the spacer. The rim assists in trapping the air and pressurising the air at the tip of the fan blades to direct the air flow in the direction of the outlet(s), by restricting air flow in other directions. The spacer may be attached to either the first/inlet-side heat sink or the second/outlet-side heat sink. The first/inlet-side heat sink is preferably attached to the front housing component. The front housing component and rear housing component may be separated so that the fan can be exposed for removal allowing for repair or replacement.

The image sensor and the optical system may constitute an image capture module. The image capture module may be a sealed module.

Each image sensor may have an imaging plane, said image sensor being mounted within the housing such that the imaging plane lies at a predefined distance from a plane of a mounting face of the lens mount. The at least one image sensor may be mounted to the image capture module via an adjustable mounting structure to allow adjustment of the position of the at least one image sensor position with respect to the housing and lens mount. The at least one image sensor may be mounted to a substrate, such as the sensor PCB, wherein the adjustable mounting structure includes a series of adjustment screws holding the substrate to the housing. Said adjustable mounting structure may further include one or more spacers positioned between the substrate and the housing to set the predefined distance between the imaging plane and the plane of the mounting face of the lens mount.

A power supply subsystem may be mounted to the housing to supply power. Advantageously an external battery is mounted to the rear wall of the rear housing component. Alternatively power supply may be provided via a cable.

Preferably there is provided a user interface subsystem to enable the user to control the image sensor. This may be associated with the housing or may be provided remotely. The user interface subsystem preferably includes buttons and/or lights or a multifunction indicator.

A data storage subsystem may be provided to store data derived from the image sensor. The data storage subsystem can include a removable memory module. Preferably the removable memory module is a memory card.

An input and/or output subsystem is typically provided to enable data or electrical connection to another device.

In a preferred form the camera includes a data communication connection between the data processing unit and another module to exchange data between the data processing unit and the other module. Said data could be, without limitation, image data received from the image sensor; control data for controlling the operation of the optical system or lens connected thereto; sensing data derived from the image sensor, or the optical system or lens connected thereto.

The lens mount preferably includes a coupling to releasably engage a lens or other optical module thereto. The lens mount can have a mounting face against which a mating surface of a lens abuts.

One or more light transmissive elements may be provided in front of and covering the image sensor. The one or more light transmissive elements could be any type of light transmissive element including but not limited to:

One or more lenses,
One or more filters,
One or more polarisers,
A light transmissive cover.

Preferably, the optical element covering the image sensor is spaced apart from the image sensor and sealed to the housing.

As will be appreciated, direct contact in the context of heat transmission can include contact via an intermediate substance or material that aids thermal transmission between components, such as thermal grease or the like.

As used herein, except where the context requires otherwise, the term "comprise" and variations of the term, such as "comprising", "comprises" and "comprised", are not intended to exclude further additives, components, integers or steps.

BRIEF DESCRIPTION OF THE DRAWINGS

Further aspects of the present invention and further embodiments of the aspects described in the preceding paragraphs will become apparent from the following description, given by way of example and with reference to the accompanying drawings, in which.

DETAILED DESCRIPTION OF THE EMBODIMENTS

Figure 1:
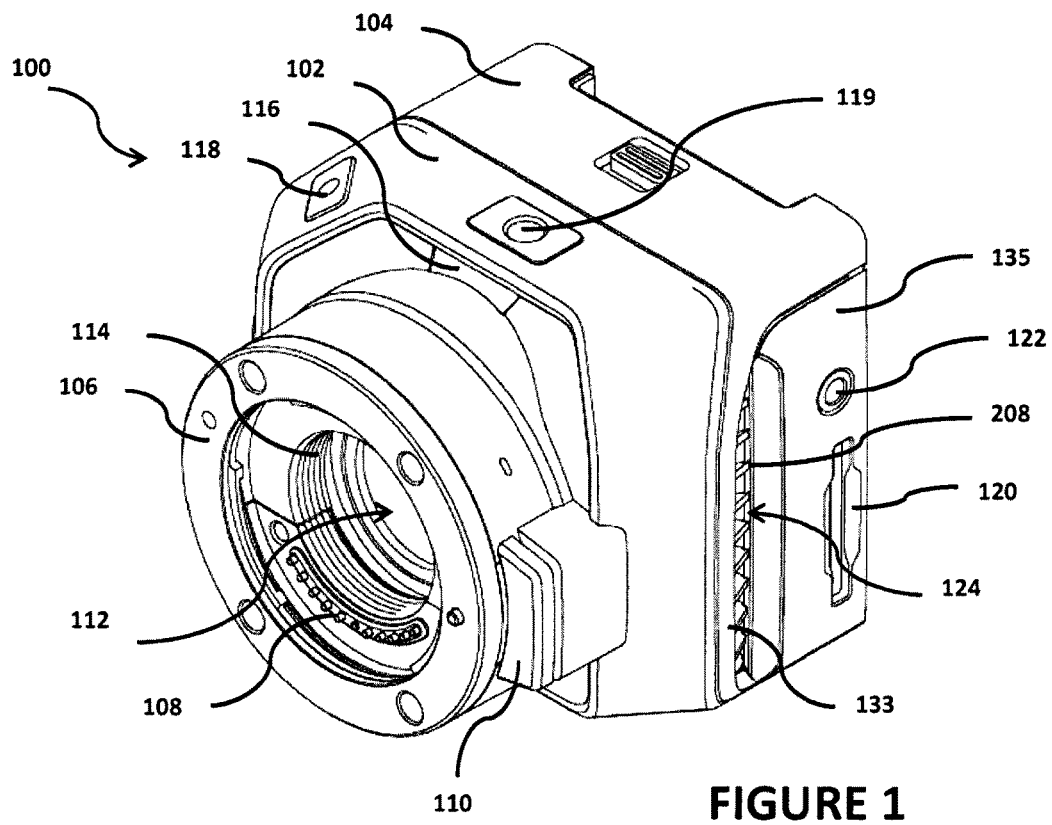
FIG. 1 is a front perspective view of a digital video camera according to a first embodiment of the invention.

FIG. 1 illustrates a digital video camera 100 according to a first embodiment. The camera 100 is generally rectangular and formed from two housing components, a front housing component 102 and a rear housing component 104. The front housing component 102 has a front side that includes a lens mount 106 including a mechanical structure configured to receive a mechanical coupling on a lens to be fitted to the mount 106. In one form the mechanical structure is arranged to receive a bayonet style mount. The lens mount 106 additionally includes a series of electrical and data contacts 108. A button 110 is also provided for disengaging a lens from the lens mount 106. In embodiments of this camera, the lens mount may be made according to a standard lens mount configuration, such as an EF mount, a MFT mount, or other lens mount.

The front housing component 102 also includes a central bore 112 for admitting light to the optical system mounted therein. The inside wall of the bore 112 includes a series of ribs to prevent reflections of off axis unfocussed light from the inside surface 114 of the bore 112 from reaching the image sensor. Also provided, but not visible, is an outer cover, in the form of an optical filter to seal the sensitive parts of the front housing component 102.

At the top of the front housing component 102 is a light indicator 116, which may be an RGB LED multifunction indicator. In the embodiment shown in FIG. 1, there is also provided a user interface button. The user interface button is a record button 118, which actuates recording by the camera. This button 118 is easily accessible by a user from the front of the camera 100.

The front housing component 102 is preferably made from magnesium, giving it strength, whilst being light. On the top side and bottom side of the front housing component 102 there is provided a number of mounting points 119. The mounting points 119 allow for the attachment of the camera 100 to external accessories or supports, such as a tripod. The strength provided by the magnesium also accommodates the weight of the lenses attached to the lens mount.

Rear housing component 104 is generally rectangular. Provided on the right side of the rear housing component 104 is an outlet 124, which is a tall slender opening in the housing wall. In front of the outlet 124 is a forward column 133 that defines the front of the outlet 124.

Also on this side of the rear housing component 104 is a slot 120 in rear wall 135 for receiving a memory device, such as a memory card, or the like. There is also provided a plug 122 for an audio input.

Figure 2:
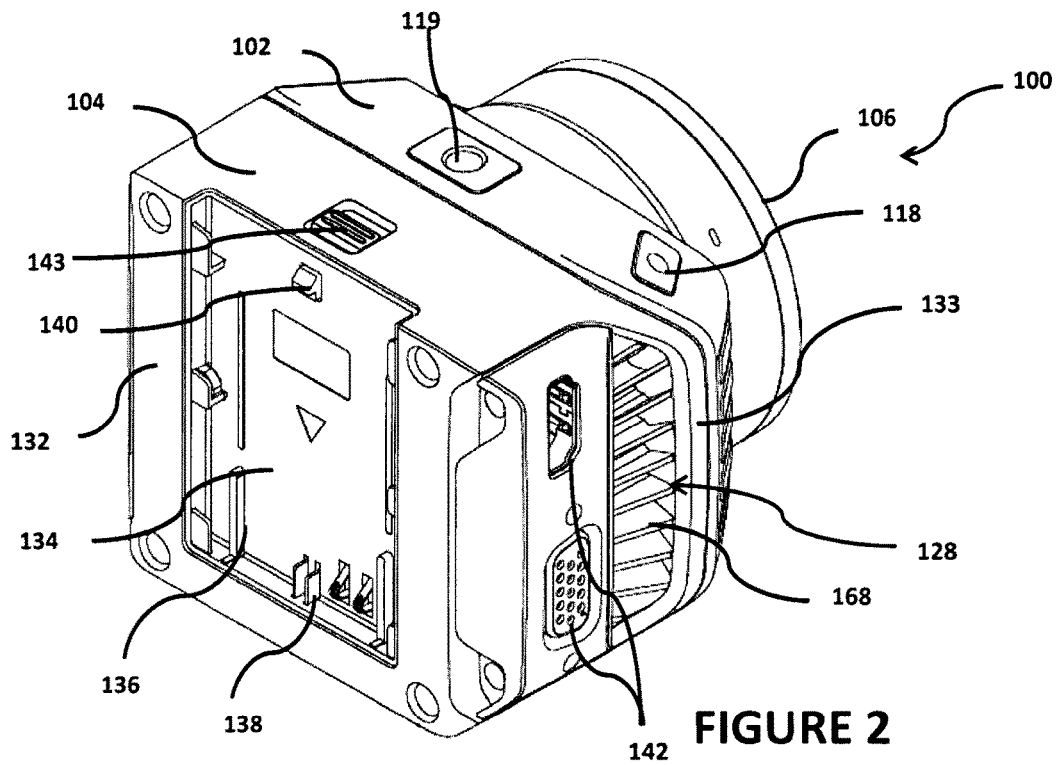
FIG. 2 is a rear perspective view of the digital video camera of FIG. 1.

FIG. 2 shows a rear perspective view of the camera 100 showing the opposite left side of the camera. This side of the camera includes an inlet 128, which is identical to outlet 124 in appearance, being a tall slender opening defined on a front side by a column 133.

On the rear side 132 of the rear housing component 104 is a cut out area 134 for receiving an externally mounted battery. The cut out area 134 includes rails 136, which correspond to slots in the battery. Electrical contacts 138 connect to the battery to provide power to the camera 100. A retractable clasp 140 is provided to lock into a slot in the back of the battery and hold the battery in the cut out area 134. The battery slides vertically into the cut out area 134 from the top. The battery depresses the clasp until fully inserted. The clasp 140 then extends and holds the battery in place. To release the battery, a slider 142 can be used, which retracts the clasp 140 allowing the battery to be slid upwards.

On the left side of the rear housing shown in FIG. 2 are two connection ports 142 on rear wall 135, which allow for the connection of cables to provide power and/or data transfer.

Figure 3:
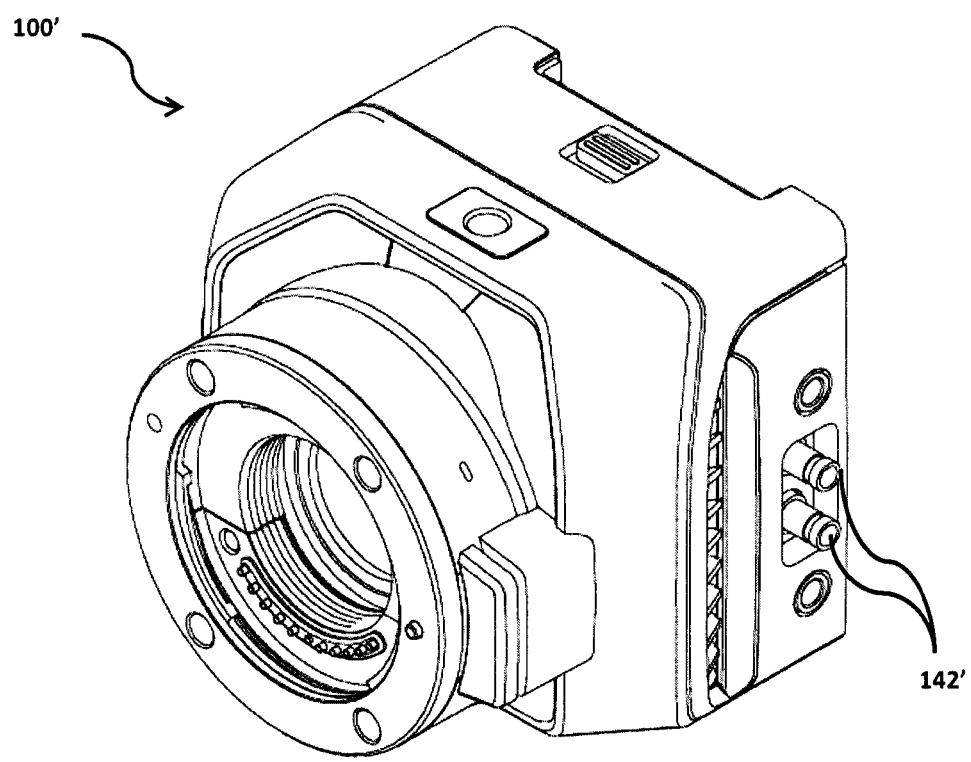
FIG. 3 is a front perspective view of a digital video camera according to a second embodiment of the invention.

FIG. 3 shows an alternative embodiment of the camera 100' to that shown in FIGS. 1 and 2. Camera 100' includes all of the features discussed above in relation to camera 100, with the exception of the user interface button 118. Camera 100' may be a "broadcast" camera variant, that includes a limited user interface or internal memory and is remotely controlled. To this end, camera 100' shown in FIG. 3 therefore includes connectors 142', which communicate with an external interface and memory.

Figure 4:
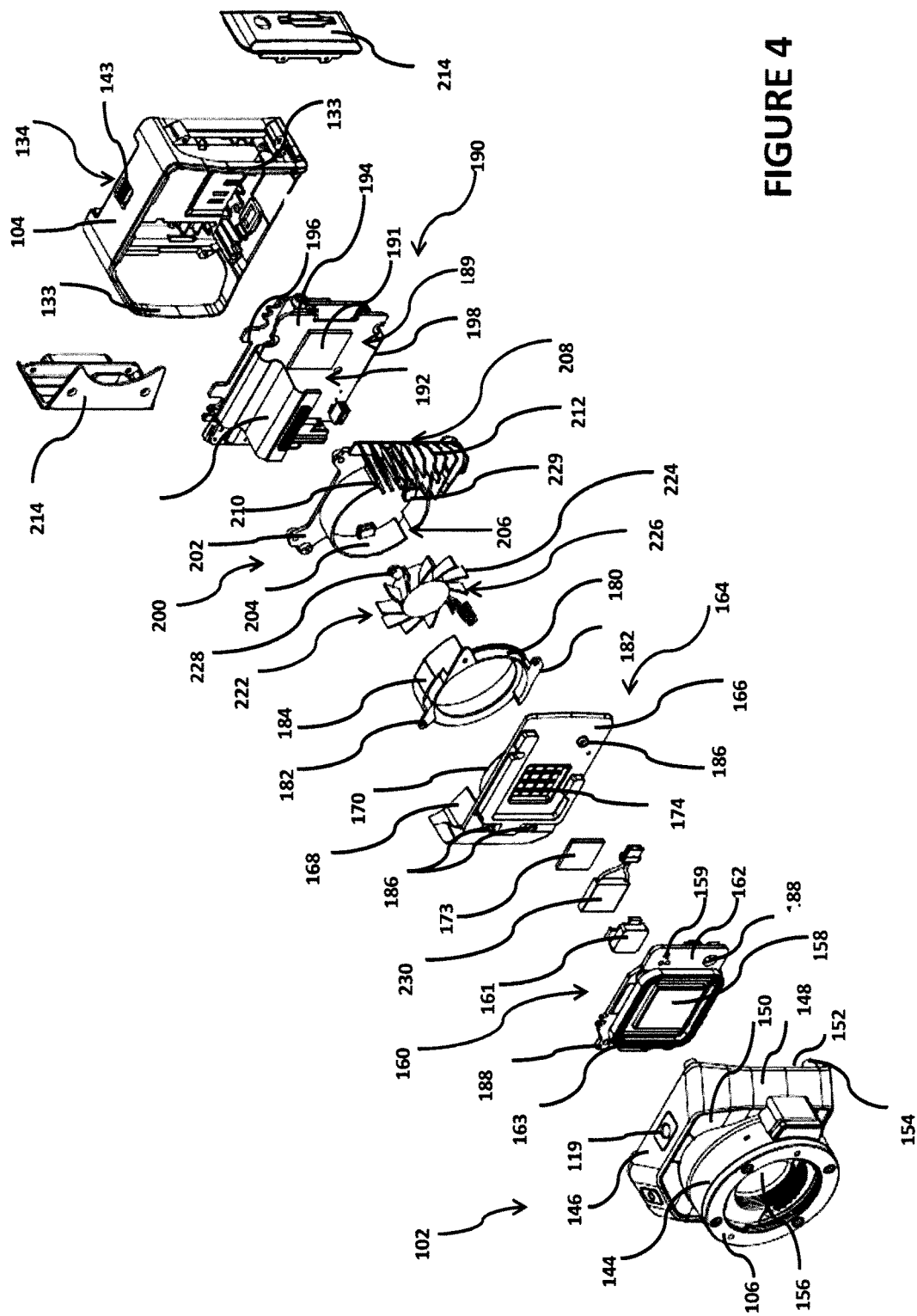
FIG. 4 is an exploded front perspective view of the digital video camera of FIG. 1.

FIG. 4 is an exploded view of the components of the camera 100. At the foreground is the front housing component 102, which is as discussed earlier in relation to FIG. 1. It includes a lens mount 106 including a mechanical structure configured to receive a mechanical coupling on a lens to be fitted to the mount 106. The front housing component 102 also includes a central bore 112 for admitting light to the optical system mounted therein. Light indicator 116 and mounting point 119 are also provided.

The front housing component 102 has a cylindrical front portion 144 and a generally rectangular rear portion 146. The sides 148 of the rear portion 146 are outwardly flared from a front face 150 to a rear edge 152. Extending rearwardly from the rear edge 152 is a series of bosses 154 for receiving fasteners (not shown) to secure the front housing component 102 to the rear housing component 104.

Turning back to FIG. 1, when the front housing component 102 and the rear housing component 104 are joined together, the outwardly flared sides 148 of the front housing component 102 line up with the forward columns 133 on the rear housing component 104. The rear walls 135 are inset from the flared columns 133 such that openings 128 and 124 are oriented on an angle. The benefit of this is that if the camera is laid on its side, the openings are not obstructed and air flow will be maintained through the housing.

Light enters the camera 100 through an aperture 156 and passes through an optical system and is received at an image sensor 158. The image sensor 158 can include one or more devices which convert received light to electrical signals, for example a charge coupled device (CCD) or complementary metal oxide semiconductor (CMOS) pixel sensor. In some embodiments this may be a 4K video format or higher resolution sensor, in others it will be HD, but, as will be appreciated, a person skilled in the art will be able to choose an image sensor having suitable operational parameters (e.g. sensor size, resolution etc.) to suit requirements.

An image sensor assembly 160 includes a substrate 162 which, in this example is a printed circuit board (PCB) substrate, which carries the image sensor 158. The image sensor assembly 160 is mounted to the front housing component 102 via a series of screws (not shown). The screws are used to provide an adjustable mounting for the image sensor assembly 160 when mounting it to the front housing component 102. The mounting can additionally include one or more spacers such as shims 159 of thin metal or the like which can be used to adjust the positioning of the image sensor assembly 160 with respect to the front housing component 102. In particular, it is important that the image sensor 158 is correctly located with respect to the central axis of the aperture 156 and that its position in a forwards and backwards direction is set accurately with respect to the front mounting face of the lens mount 106. A seal 163 is provided on the front of the image sensor assembly 160.

Figure 5:
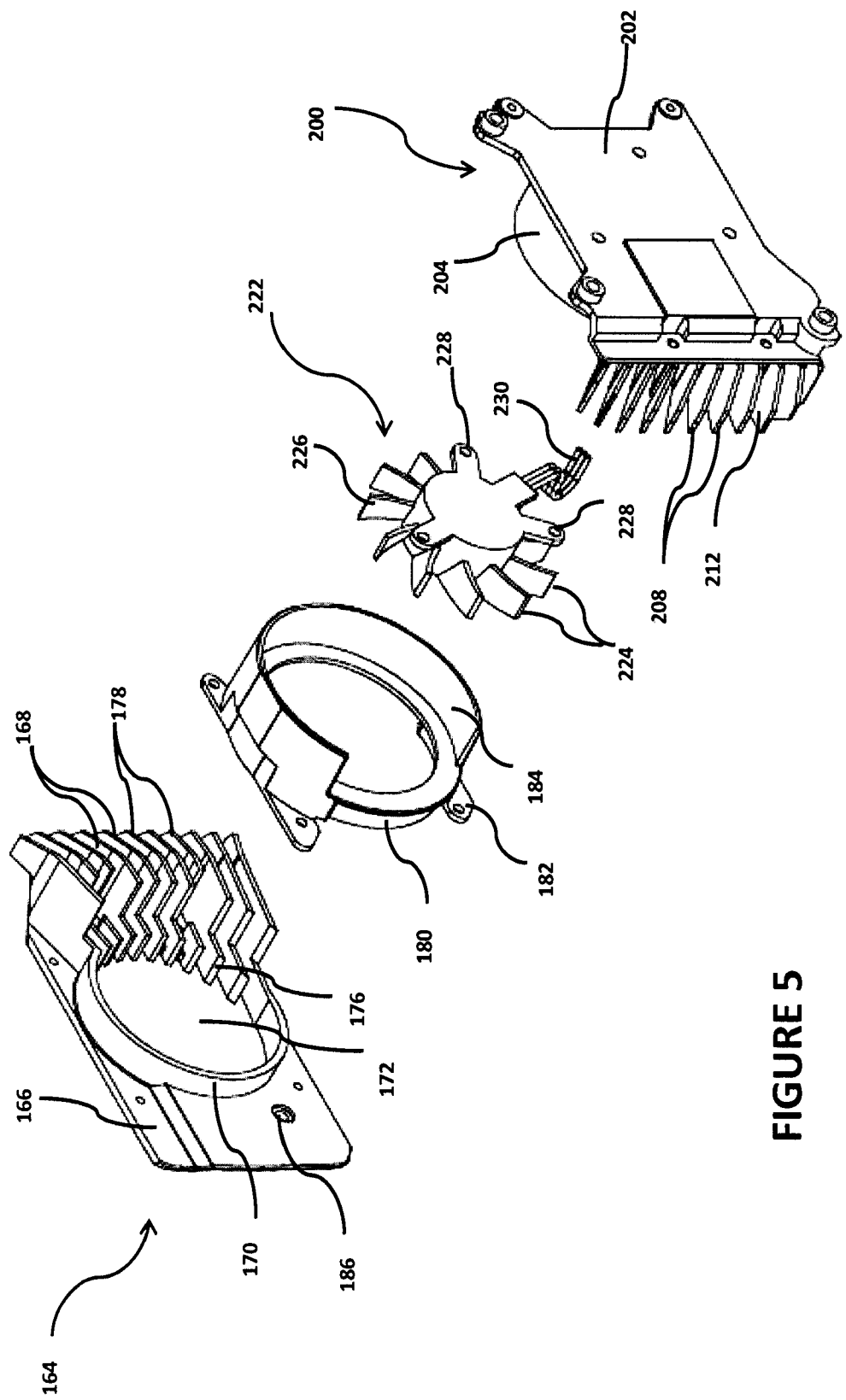
FIG. 5 is an exploded rear perspective view of the first/inlet-side heat sink, the spacer, the fan and the second/outlet-side heat sink.

Located behind the image sensor assembly 160 is a first heat sink, being an inlet-side heat sink 164. The inlet-side heat sink 164 has a generally flat plate 166 and a series of fins 168 (best shown in FIG. 5). The fins 168 extend generally perpendicularly from the rear side of the flat plate 166. A rim 170 also extends from the rear side of the flat plate 166 leaving a central cavity 172. On the front side of the flat plate 166 are a number of ribs 174 that allows space for a gap pad 173 to be received as it is compressed between components. The inlet-side heat sink 164 is made from die cast aluminium, however it will be appreciated that other conductive materials and manufacturing techniques may be utilised.

Heat from the image sensor 158 is thermally transferred to the inlet-side heat sink 164 via a copper block 161 and the gap pad 173 and any necessary thermal interface material such as thermal grease. Together, these components form part of the heat management system.

The heat management system can include a cooling subsystem 230 which draws heat away from the image sensor 158 in order to maintain correct operation of the sensor. In a preferred form the temperature of the image sensor is maintained at a constant level, hence it is preferable to use an active cooler, such as a Peltier cooler 230 that can vary its heating and cooling effectiveness to suit variations in the temperature level of the image sensor. The Peltier cooler 230 is mounted in thermal contact with the rear side of the image sensor 158, via copper block 161.

The image sensor 158 is very sensitive to temperature variation. It is for this reason that the direction of air flow is such that the heat sink 164 that is thermally connected to the image sensor 158 is cooled first. Whilst the data processing unit 190 is a higher power component and produces more heat, it is less sensitive to temperature fluctuations. So whilst it is standard practice to design cooling systems to prioritise cooling of the higher heat generating components, the present invention reverses that thinking in order to deliver a more constant temperature to the lower power component, being the image sensor.

A spacer 180 is attached to the rear side of the inlet-side heat sink 164. It will be appreciated that the spacer could also be attached to an outlet-side heat sink. The spacer 180 is generally cylindrical, with arms 182 to allow the spacer to be screwed to the heat sink 164. A wall 184 protrudes from the rear side of the spacer 180 and will be explained further below. The spacer is made from a low thermally conductive material, such as plastic.

The joined spacer 180 and inlet-side heat sink 164 are fastened to the front housing component 102 with screws that pass through apertures 186 in the heat sink 164 and through apertures 188 in the sensor PCB 162. This clamps the heat sink 164 firmly against the rear of the image sensor assembly 160. These components are stacked together in a single direction to form a front section of the camera 100. It will be appreciated that alternative mounting arrangements may be utilised.

Housed within the rear housing component 104 is a data processing unit 190. The data processing unit 190 includes a main PCB 192, which is provided across two substrates 194, 196 that are connected at join 198. The main PCB includes a field programmable gate array (FPGA) 191 or other data processing system, such as a programmable micro controller, application-specific integrated circuit (ASIC) or the like, and is used to process image data and control operation of the camera as will be known to those skilled in the art.

In a most preferred embodiment the component of the data processing unit 190 which generates the most heat, likely to be the FPGA 191 or other primary data processing element, is mounted so as to be exposed to or in thermal contact with, the front-most side 189 of the front substrate 194 so that it can efficiently transfer heat to a second, outlet-side, heat sink 200.

The rear housing component 104 is made from a thermoplastic polymer, such as ABS. As strength is provided by the front housing component 102, the rear housing component can be from a material with a lower thermal conductivity. The rear housing component 104 will therefore not be as hot to touch and this is the part of the camera that a user is likely to hold.

In front of the data processing unit 190 is the outlet-side heat sink 200. Similar to the inlet-side heat sink 164, the outlet-side heat sink 200 includes a plate 202. On the front side of the plate 202 is a rim 204, which includes a gap 206 to be described below. A series of fins 208 extend generally perpendicularly from the front side of the flat plate 202 in fanned array. The inner ends 210 are closer together than their outer ends 212.

The outlet-side heat sink 200 is fastened to the data processing unit 190 and then to the rear housing component 104. Side cover plates 214 attach to the outlet-side heat sink 200 and the rear housing component 104.

The outlet-side heat sink 200, the data processing unit 190 and the rear housing component 104 are stacked together in one direction to form a rear section of the camera 100.

The outlet-side heat sink 200 is made from aluminium or other suitable thermally conductive material and draws heat away from the data processing unit 190.

The main PCB 192 connects to the image sensor assembly 160 via a ribbon cable 220.

Placed in between the front section and rear section of the camera is a fan 222. Fan 222 is a centrifugal fan, meaning one that draws air inwardly from an axial direction, and pushes it radially out the side past the tips 224 of the blades 226. The outlet-side heat sink fins 208 are arranged tangentially to the fan blades 226 so the air does not have to change direction to escape out the outlet 128. Together with the inlet-side and outlet-side heat sinks, the centrifugal fan forms part of the heat management system.

The centrifugal fan 222 includes arms 228 that are held in rubber boots 229 that extend from the outlet-side heat sink 200. This holds the centrifugal fan 222 inside the rim 204 and the rubber boots 229 limit vibration transfer. The centrifugal fan 222 is powered via cable 230, which projects through gap 206 in the rim 204 and connects back to the main PCB.

When clamped together, all the components are stacked in a single direction, with the central cavity 17 on the inlet-side heat sink 164 creating clearance in front of the fan 222 for airflow.

The use of a centrifugal fan 222 results in air flow space being required in front of the fan, and in at least one lateral direction, i.e. in different dimensions. Thus the air is blown out the side of the stack of components, with the fins 208 of the outlet-side heat sink 200 located in this direction. This is in contrast to an axial fan, which requires air flow space in front and behind a fan i.e. in the same dimension. The flow path through the centrifugal fan is advantageous in that the direction of flow changes between its inlet and outlet. This allows the flow path to be routed through the camera in a space efficient manner.

Centrifugal fans are more space efficient than axial fans, as the inlet and outlet can be more restricted. This is due to the fact that the rim on the inlet traps the air more effectively than the open blades of an axial fan, once the air is past the rim it is trapped and spun to the tips of the blades. Axial fans are prone to re-circulation, unless the inlet and outlet are open and clear. Large industrial axial fans will preferably be housed within a tube for this reason.

However, centrifugal fans work by building pressure rather than air flow. This results in lower flow and higher noise. For most cinema cameras airflow i.e. cooling capacity, and reduced noise are rated higher than space saving. The present invention inverts the priorities, whilst still managing to attain all the performance characteristics of this type of digital video camera. This ability to deal with smaller clearances enables the outlet to have heat sink fins located against it, with little loss of pressure.

A centrifugal fan 222 can be quite large given the overall size of the camera housing. In the embodiment illustrated in FIG. 1-9, the fan 222 is 40 mm in diameter and 8 mm in thickness. The housing is around 65.4 mm high, 82.5 mm wide and 69.5 mm deep. The large size allows for the centrifugal fan to be operated at a relatively low speed. This reduces fan noise, and importantly reduces the amount of noise picked up by the user and the microphones that are housed in the front housing component 102.

In the embodiment illustrated in FIGS. 1 to 9, the centrifugal fan 222 is positioned between the two heat sinks 164, 200. The central rotational axis of the centrifugal fan 222 is generally perpendicular to the line between the inlet 128 and the outlet 124. This is contrary to standard arrangements, where an axial fan would require its axis to be parallel to the line between the inlet 128 and the outlet 124. Using a centrifugal fan in this orientation allows for a larger diameter fan than if an axial fan were used. If access is required to the fan 222 for servicing or replacement, the front section and rear section can be separated exposing the fan 222.

FIGS. 6 through 9 show various cross-sectional views through the camera 100. These views show how all of the components are layered one behind the other to create the high performance camera within a very small outer housing.

Figure 6:
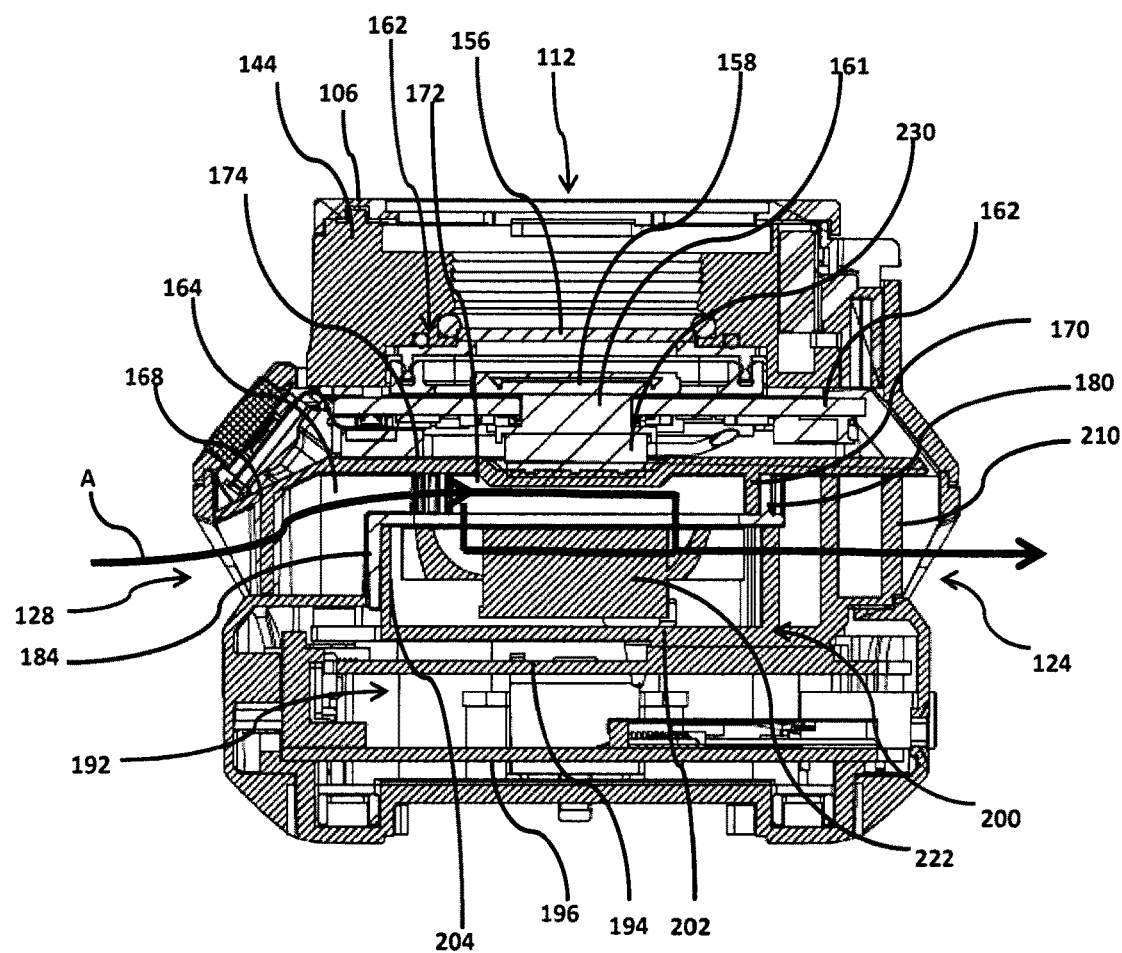
FIG. 6 is a bottom cross-sectional view through the centre of the digital video camera shown in FIG. 1.
Figure 7:
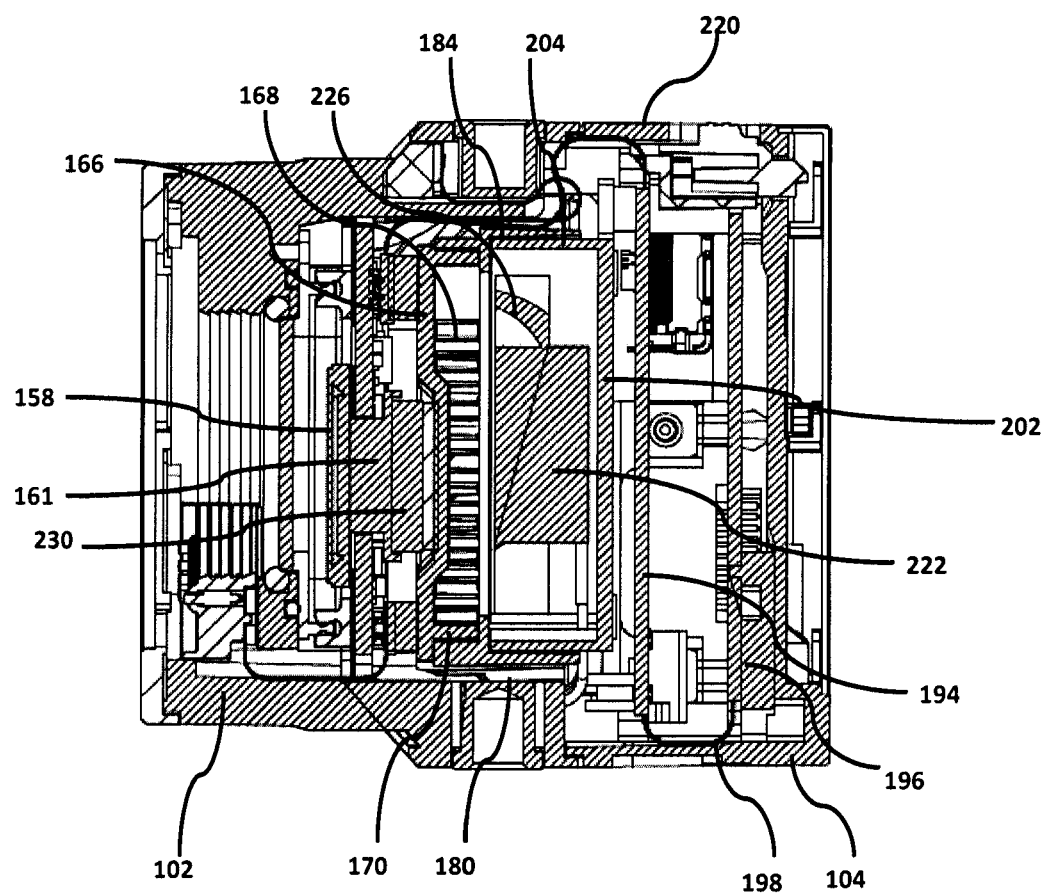
FIG. 7 is a side cross-section view through the centre of the digital video camera shown in FIG. 1, looking towards the inlet side.
Figure 8:
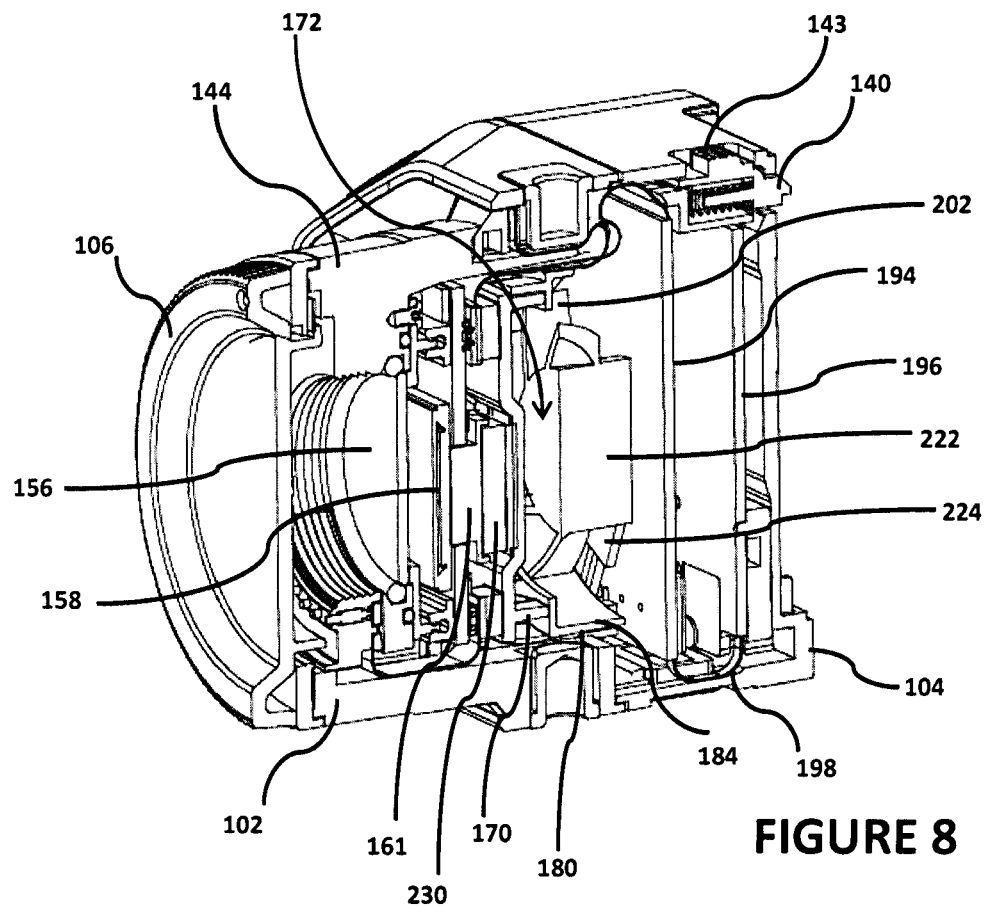
FIG. 8 is a perspective side cross-section view through the centre of the digital video camera shown in FIG. 1, looking towards the inlet side.
Figure 9:
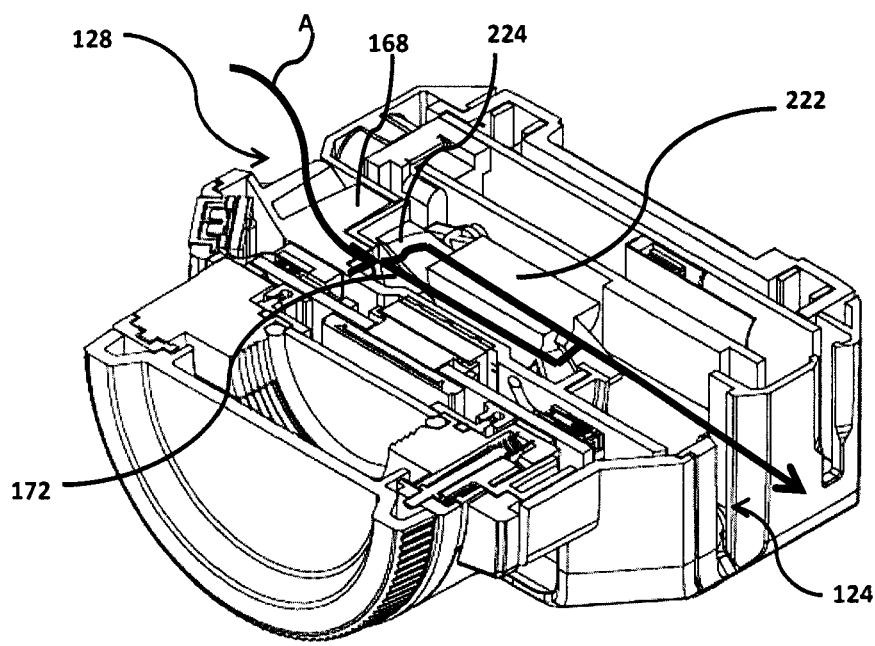
FIG. 9 is a perspective top cross-section view through the centre of the digital video camera shown in FIG. 1.

As shown in FIGS. 6 and 9, the direction of the airflow is represented by arrow A. The rotation of the centrifugal fan 222 draws air through the inlet 128. The air then passes through the fins 168 on the inlet-side heat sink 164 into the central cavity 172 created by the rim 170 of the inlet-side heat sink 164 in front of the fan 222. It will be appreciated that inlet-side heat sink 164 may not include fins 168. Alternatively, the depth of the fins 168 may be reduced so that they are only provided to create a visually symmetrical pattern though inlet 128 to the fins 208 seen through outlet 124. The heat from the image sensor 158 passes into the inlet-side heat sink 164. As the air flows over the inlet-side heat sink 164 heat passes into the air, raising the temperature of the air.

The air is drawn from the central cavity 172 into the fan blades 226 in a generally axial direction. Due to the restricted cavity 172 the air flow direction starts off as radial and bends to become axial as it enters the fan. The rim 204 on the inlet side of the outlet-side heat sink 200 and wall 184 of the spacer 180 prevents that air from escaping into the rear of the camera housing. The rim traps the air and pressurises the air at the tips 226 of the fan blades 224. The heat from the data processing unit 190 passes into the outlet-side heat sink 200. The air changes direction and is pushed outwards by the tips 226 of the fan blades, directing the air radially across the fins 208 of the outlet-side heat sink 200. The air then travels out of the housing through outlet 124.

Figure 10:
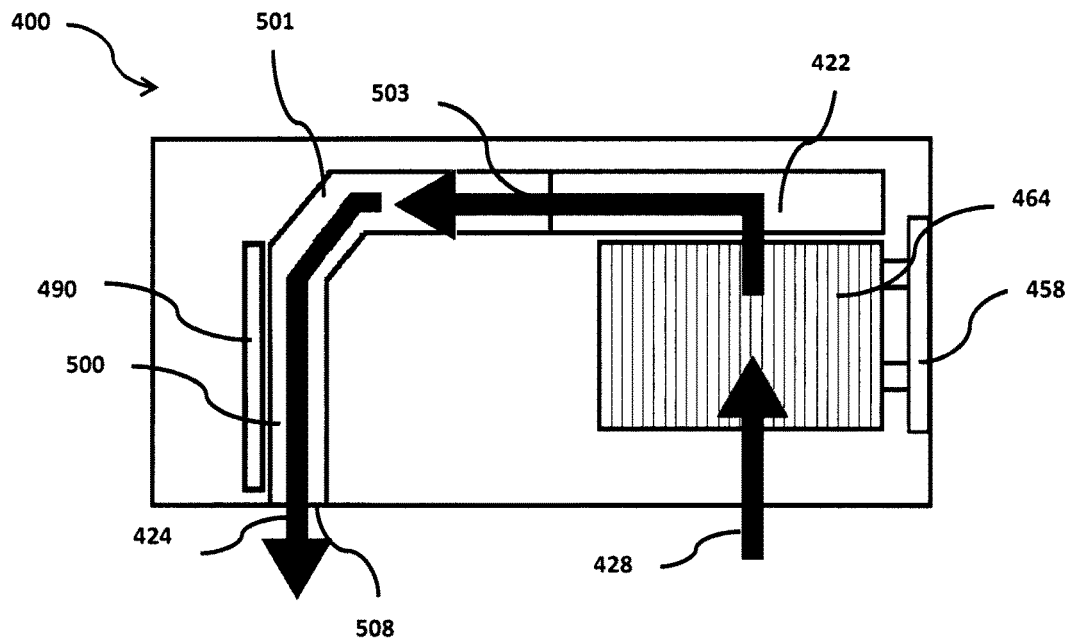
FIG. 10 is a view of a camera housing with an internal configuration according to a second embodiment.

FIG. 10 shows an alternative embodiment of the camera 400. In this configuration there is a first heat sink 464 and a second heat sink 500 positioned with a centrifugal fan 422. The first heat sink 646 and fan 422 are aligned with the inlet 428 such that air flows through the inlet, through the first heat sink 464, into the front of the fan 422 in an axial direction. The second heat sink 500 is contained within a duct 501. The duct 501 is L-shaped or curved such that a first end 503 of the duct 501 connects to the side of the centrifugal fan 422 and the heat sink fins 508 extend at a right angle. The inlet 428 and outlet 424 are therefore on the same side of the housing and the air flow path is generally U-shaped. The advantage of this configuration is that a relatively slim width is achieved. Moreover, in a hand-held camera application, this configuration puts the inlet and outlet on the same side of the housing so they can be kept away from the user's hand, which can grasp the opposite side of the housing. As with the early embodiments, the first heat sink 464 is associated with the image sensor 458. The second heat sink 500 is associated with the data processing unit 490.

Figure 11:
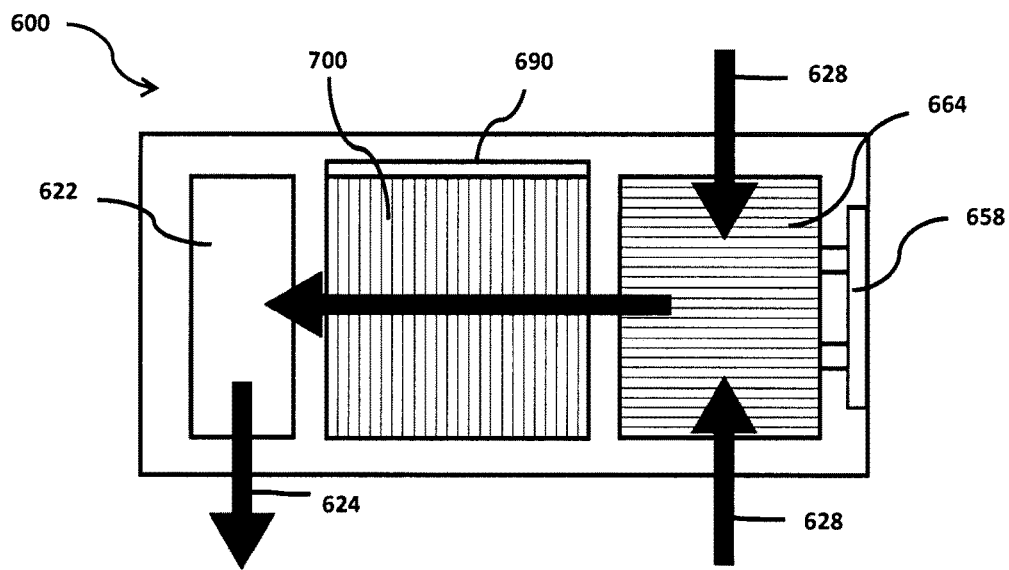
FIG. 11 is a view of a camera housing with an internal configuration according to a third embodiment.

FIG. 11 shows an alternative third embodiment of the camera 600. In this configuration the centrifugal fan 622 is located after the first and second heat sinks 664, 700. There are inlets 628 provided on opposing sides of the housing adjacent the first heat sink 664. Air is then drawn towards the fan 622 in an axial direction through the second heat sink 700. The air is then directed out the side of the fan 622 out the outlet 624. The outlet 624 may be located on the same side as one of the inlets 628 or on a side of the housing perpendicular to the inlets.

In both of the configurations shown in FIG. 10 and FIG. 11, the flow path of air changes direction twice from the inlet to the outlet. One of these changes is due to the use of a centrifugal fan. The other is due to the shape or orientation of the heat sinks.

In each of the configurations the centrifugal fan draws air into the front of the fan in an axial direction and pushes air radially out in a side with direction such that the air flow path bends as it goes through the fan. The air travels over the first the sink associated with the image sensor and then over the second heat sink associated with the data processing unit.

It has been realised that a compact digital video camera can be designed that utilises a cinema-quality image sensor by providing a stable temperature for the image sensor rather than maximising cooling to the high power components. The use of a centrifugal fan allows maximisation of air flow, with relatively low noise, in a compact housing.

The present invention therefore allows for cinematographic level components, such as a 4K image sensor, to be contained within a very small housing. The reason this can be accomplished is through effectively maintaining the temperature of the image sensor using a compact heat management system.

It will be understood that the invention disclosed and defined in this specification extends to all alternative combinations of two or more of the individual features mentioned or evident from the text or drawings. All of these different combinations constitute various alternative aspects of the invention.

The invention claimed is:

1. A compact digital video camera, including:
   a housing having a front, a rear and four sides;
   at least one image sensor to convert light into electrical signals;
   an optical system associated with the image sensor;
   a lens mount on the front of the housing for releasably engaging a lens or other optical module;
   data processing unit(s) to process image data received from the image sensor(s); and
   a heat management system, which includes:
      at least one inlet and at least one outlet in the housing to enable air to flow through the housing;
      an inlet-side heat sink thermally connected to the image sensor(s), and an outlet-side heat sink thermally connected to the data processing unit(s), said inlet-side heat sink being separated from the outlet-side heat sink; and
      a fan configured to draw air into the housing through the inlet(s) over the inlet-side heat sink and push air over the outlet-side heat sink out the outlet(s);
   wherein the side(s) of the housing having the inlet(s) and/or outlet(s) have an inset wall portion containing the inlet(s) and/or outlet(s), with openings for the inlet(s) and outlet(s) that cannot be obstructed by laying the camera on either side.

2. A compact digital video camera according to claim 1, wherein the fan is a centrifugal fan, such that air is drawn into the front of the fan and pushed out one side of the fan.

3. A digital video camera according to claim 2, wherein the centrifugal fan is located between the inlet-side heat sink and the outlet-side heat sink.

4. A compact digital video camera according to claim 1, wherein the housing is provided as two components, a front housing component and a rear housing component, and the inlet(s) and outlet(s) are provided on the rear housing component.

5. A compact digital video camera according to claim 4, wherein at least one side of the front housing component is outwardly flared from a front face to a rear edge and a corresponding side wall of the rear housing component is inset from said rear edge.

6. A compact digital video camera according to claim 5, wherein the inset side wall orientates the openings for the inlet(s) and outlet(s) on an angle.

7. A compact digital video camera according to claim 1, wherein the inlet(s) and outlet(s) are openings located on opposing sides of the housing.

8. A compact digital video camera according to claim 1, wherein a spacer is provided to physically separate the inlet-side heat sink and the outlet-side heat sink.

9. A compact digital video camera according to claim 8, wherein the spacer is made from a low thermally conductive material, to provide a thermal break between the inlet-side heat sink and the outlet-side heat sink.

10. A compact digital video camera according to claim 2, wherein a spacer is provided to physically separate the inlet-side heat sink and the outlet-side heat sink, and wherein the spacer surrounds the centrifugal fan and includes a rim that extends around the spacer on a side adjacent the inlet-side, to assist in trapping the air and pressurising the air at a tip of a plurality of fan blades of the centrifugal fan to direct the air flow in a direction of the outlet(s).

11. A compact digital video camera, including:
   a housing having a front, a rear and four sides;
   at least one image sensor to convert light into electrical signals;
   an optical system associated with the image sensor;
   a lens mount on the front of the housing for releasably engaging a lens or other optical module;
   data processing unit(s) to process image data received from the image sensor(s); and
   a heat management system, which includes:
      at least one inlet and at least one outlet in the housing to enable air to flow through the housing;
      an inlet-side heat sink thermally connected to the image sensor(s), and an outlet-side heat sink thermally connected to the data processing unit(s), said inlet-side heat sink being separated from the outlet-side heat sink; and
      a fan configured to draw air into the housing through the inlet(s) over the inlet-side heat sink and push air over the outlet-side heat sink out the outlet(s);
   wherein the inlet(s) and outlet(s) are openings located on opposing sides of the housing.

12. A compact digital video camera, including:
   a housing having a front, a rear and four sides;
   at least one image sensor to convert light into electrical signals;
   an optical system associated with the image sensor;
   a lens mount on the front of the housing for releasably engaging a lens or other optical module;
   data processing unit(s) to process image data received from the image sensor(s); and
   a heat management system, which includes:
      at least one inlet and at least one outlet in the housing to enable air to flow through the housing;
      an inlet-side heat sink thermally connected to the image sensor(s), and an outlet-side heat sink thermally connected to the data processing unit(s), said inlet-side heat sink being separated from the outlet-side heat sink; and
      a fan configured to draw air into the housing through the inlet(s) over the inlet-side heat sink and push air over the outlet-side heat sink out the outlet(s);

wherein the housing is provided as two components, a front housing component and a rear housing component, and the inlet(s) and outlet(s) are provided on the rear housing component.

13. A compact digital video camera according to claim 12, wherein the front housing component and rear housing component are able to be separated so that the fan can be exposed for removal allowing for repair or replacement.

14. A compact digital video camera, including:
a housing having a front, a rear and four sides;
at least one image sensor to convert light into electrical signals;
an optical system associated with the image sensor;
a lens mount on the front of the housing for releasably engaging a lens or other optical module;
data processing unit(s) to process image data received from the image sensor(s); and
a heat management system, which includes:
at least one inlet and at least one outlet in the housing to enable air to flow through the housing;
an inlet-side heat sink thermally connected to the image sensor(s), and an outlet-side heat sink thermally connected to the data processing unit(s), said inlet-side heat sink being separated from the outlet-side heat sink; and
a fan configured to draw air into the housing through the inlet(s) over the inlet-side heat sink and push air over the outlet-side heat sink out the outlet(s);
wherein a spacer is provided to physically separate the inlet-side heat sink and the outlet-side heat sink.

15. A compact digital video camera according to claim 14, wherein the spacer is made from a low thermally conductive material, to provide a thermal break between the inlet-side heat sink and the outlet-side heat sink.

16. A compact digital video camera according to claim 14, wherein the fan is a centrifugal fan and the spacer surrounds the centrifugal fan and includes a rim that extends around the spacer on a side adjacent the inlet-side, to assist in trapping the air and pressurising the air at a tip of a plurality of fan blades of the centrifugal fan to direct the air flow in a direction of the outlet(s).

17. A compact digital video camera, including:
a housing having a front, a rear and four sides;
at least one image sensor to convert light into electrical signals;
an optical system associated with the image sensor;
a lens mount on the front of the housing for releasably engaging a lens or other optical module;
data processing unit(s) to process image data received from the image sensor(s); and
a heat management system, which includes:
at least one inlet and at least one outlet in the housing to enable air to flow through the housing;
an inlet-side heat sink thermally connected to the image sensor(s), and an outlet-side heat sink thermally connected to the data processing unit(s), said inlet-side heat sink being separated from the outlet-side heat sink; and
a fan configured to draw air into the housing through the inlet(s) over the inlet-side heat sink and push air over the outlet-side heat sink out the outlet(s);
wherein the housing is provided as two components, a front housing component and a rear housing component, and the front housing component is made from a stronger material than the rear housing component.

18. A compact digital video camera according to claim 17, wherein the front housing component is made from magnesium and the rear housing component is made from a plastic.

19. A compact digital video camera according to claim 17, wherein the front housing component also includes one or more microphones, positioned such that they are mechanically isolated from the fan to minimise noise transmission through the camera to a transducer of at least one of the one or more microphones.

20. A compact digital video camera, including:
a housing having a front, a rear and four sides;
at least one image sensor to convert light into electrical signals;
an optical system associated with the image sensor;
a lens mount on the front of the housing for releasably engaging a lens or other optical module;
data processing unit(s) to process image data received from the image sensor(s); and
a heat management system, which includes:
at least one inlet and at least one outlet in the housing to enable air to flow through the housing;
an inlet-side heat sink thermally connected to the image sensor(s), and an outlet-side heat sink thermally connected to the data processing unit(s); and
a centrifugal fan configured to draw air into the housing through the inlet(s) over the inlet-side heat sink and push air over the outlet-side heat sink out the outlet(s);
wherein a restricted cavity is provided in front of the centrifugal fan such that air is drawn into the fan from the cavity and expelled from the fan in a lateral direction.

* * * * *